United States Patent
Takagi (10) Patent No.: US 12,075,568 B2
(45) Date of Patent: Aug. 27, 2024

(54) ALLOWABLE VALUE SETTING DEVICE AND ALLOWABLE VALUE SETTING METHOD

(71) Applicant: FUJI CORPORATION, Chiryu (JP)

(72) Inventor: Takanori Takagi, Okazaki (JP)

(73) Assignee: FUJI CORPORATION, Chiryu (JP)

(*) Notice: Subject to any disclaimer, the term of this patent is extended or adjusted under 35 U.S.C. 154(b) by 626 days.

(21) Appl. No.: 17/310,286

(22) PCT Filed: Feb. 5, 2019

(86) PCT No.: PCT/JP2019/004068
§ 371 (c)(1),
(2) Date: Jul. 27, 2021

(87) PCT Pub. No.: WO2020/161802
PCT Pub. Date: Aug. 13, 2020

(65) Prior Publication Data
US 2022/0142026 A1    May 5, 2022

(51) Int. Cl.
*H05K 13/08* (2006.01)
*H05K 13/04* (2006.01)

(52) U.S. Cl.
CPC ....... *H05K 13/087* (2018.08); *H05K 13/0409* (2018.08)

(58) Field of Classification Search
CPC .......... H05K 13/087; H05K 13/0409; H05K 13/085; H05K 13/0417
See application file for complete search history.

(56) References Cited

U.S. PATENT DOCUMENTS

2010/0050429 A1* 3/2010 Maenishi ............. H05K 1/0269
29/832
2018/0199480 A1* 7/2018 Taniguchi .......... H05K 13/0815

FOREIGN PATENT DOCUMENTS

| EP | 1 189 497 A2 | 3/2002 | |
| EP | 1 876 879 A2 | 1/2008 | |
| EP | 3843519 B1 * | 9/2023 | ............ H05K 13/02 |
| JP | 4-328900 A | 11/1992 | |

(Continued)

OTHER PUBLICATIONS

International Search Report mailed on Apr. 16, 2019 in PCT/JP2019/004068 filed on Feb. 5, 2019 (1 page).

*Primary Examiner* — Jacob S. Scott
*Assistant Examiner* — Erin Morris
(74) *Attorney, Agent, or Firm* — Oblon, McClelland, Maier & Neustadt, L.L.P.

(57) ABSTRACT

An allowable value setting device sets an allowable value of a deviation amount between a target pickup position and an actual pickup position in a component when the component is picked up by a suction nozzle. The allowable value setting device includes a first setting section and a second setting section. The first setting section sets a first allowable value, which is the allowable value for each component type of the component to be mounted on a board. The second setting section sets a second allowable value, which is the allowable value that is set for each mounting coordinate of the component and smaller than the first allowable value of the component of the same component type set by the first setting section, the second allowable value being preferentially adopted over the first allowable value in a suction process of the component.

7 Claims, 3 Drawing Sheets

(56) References Cited

FOREIGN PATENT DOCUMENTS

| JP | H11121988 A | * | 4/1999 | |
|---|---|---|---|---|
| JP | 2002-94297 A | | 3/2002 | |
| JP | 2002151896 A | * | 5/2002 | |
| JP | 2004-207372 A | | 7/2004 | |
| JP | 2018113338 A | * | 7/2018 | ......... H05K 13/0408 |
| WO | WO-2014141427 A1 | * | 9/2014 | ......... H05K 13/0404 |
| WO | WO-2015059754 A1 | * | 4/2015 | ......... H05K 13/0404 |
| WO | WO-2018138921 A1 | * | 8/2018 | ......... G06K 9/00664 |

* cited by examiner

| COMPONENT TYPE | COMPONENT DIMENSION | NOZZLE TYPE | HANDLING CONDITION | ALLOWABLE VALUE (FIRST ALLOWABLE VALUE) |
|---|---|---|---|---|
| P 1 | W 1, D 1, H 1 | N Z 1, N Z 2 | H V 1, H V 2 | T R 1 X, T R 1 Y, T R 1 Q |
| : | : | : | : | : |

| SEQUENCE NUMBER | CIRCUIT NUMBER | COMPONENT TYPE | MOUNTING COORDINATE (X-COORDINATE,Y-COORDINATE,ROTATION ANGLE) | ALLOWABLE VALUE (SECOND ALLOWABLE VALUE) |
|---|---|---|---|---|
| 0001 | R1 | P1 | X1, Y1, Q1 | (BLANK) |
| 0002 | R2 | P1 | X2, Y2, Q2 | TR2X, TR2Y, TR2Q |
| .. | .. | .. | .. | .. |
| 0011 | R11 | P1 | X11, Y11, Q11 | (BLANK) |
| 0012 | R12 | P1 | X12, Y12, Q12 | TR2X, TR2Y, TR2Q |
| .. | .. | .. | .. | .. |
| 0015 | R15 | P1 | X15, Y15, Q15 | (BLANK) |
| 0016 | R16 | P1 | X16, Y16, Q16 | TR2X, TR2Y, TR2Q |
| .. | .. | .. | | .. |

ALLOWABLE VALUE SETTING DEVICE AND ALLOWABLE VALUE SETTING METHOD

TECHNICAL FIELD

The present specification discloses a technique related to an allowable value setting device and an allowable value setting method.

BACKGROUND ART

A component mounter described in Patent Literature 1 sets a set amount for determining whether a positional deviation amount of a component with respect to a suctioned end face corresponds to a positional deviation amount prohibiting a component mounting, and such a set amount is set to each component which is to be mounted on a circuit board. When there are multiple components to be mounted at different positions even if the component types are the same, the component mounter sets the above-mentioned set amount for each component.

A component mounter described in Patent Literature 2 obtains a maximum occupied area occupied by a component on a board surface for each component when the component is mounted on a circuit board, and calculates the adjacent distance to an occupied area of another component adjacent at the closest position, for each occupied area. The component mounter measures a deviation amount between a suction nozzle and a component held by the suction nozzle when mounting the component, and mounts the held component on the circuit board when the deviation amount is equal to or less than the adjacent distance.

PATENT LITERATURE

Patent Literature 1: JP-A-2004-207372
Patent Literature 2: JP-A-2002-094297

BRIEF SUMMARY

Technical Problem

However, in the component mounters described in Patent Literature 1 and Patent Literature 2, it is not clear which allowable value is preferentially adopted between the allowable value for each component type and the allowable value for each mounting coordinate, for an allowable value of a deviation amount between a target pickup position and an actual pickup position when the component is picked up.

In consideration of such a situation, the present specification discloses an allowable value setting device and an allowable value setting method capable of setting two types of allowable values having different priorities for an allowable value of a deviation amount between a target pickup position and an actual pickup position when a component is picked up.

Solution to Problem

The present specification discloses an allowable value setting device for setting an allowable value of a deviation amount between a target pickup position and an actual pickup position in a component when the component is picked up by a suction nozzle. The allowable value setting device includes a first setting section and a second setting section. The first setting section sets a first allowable value, which is the allowable value for each component type of the component to be mounted on a board. The second setting section sets a second allowable value, which is the allowable value set for each mounting coordinate of the component and smaller than the first allowable value of the component of the same component type set by the first setting section, the second allowable value being preferentially adopted over the first allowable value in a suction process of the component.

Also, the present specification discloses an allowable value setting method for setting an allowable value of a deviation amount between a target pickup position and an actual pickup position in a component when the component is picked up by a suction nozzle. The allowable value setting method includes a first setting step and a second setting step. In the first setting step, a first allowable value, which is the allowable value for each component type of the component to be mounted on a board is set. In the second setting step, a second allowable value, which is the allowable value that is set for each mounting coordinate of the component and smaller than the first allowable value of the component of the same component type set by the first setting step, the second allowable value being preferentially adopted over the first allowable value in a suction process of the component is set.

Advantageous Effects

According to the allowable value setting device described above, there are provided a first setting section and a second setting section. As a result, the allowable value setting device can set two types of allowable values (the first allowable value and the second allowable value) having different priorities for the allowable value of the deviation amount between the target pickup position and the actual pickup position when the component is picked up. The above description of the allowable value setting device can be similarly applied to the allowable value setting method.

DESCRIPTION OF EMBODIMENTS

1. Embodiment

1-1. Configuration Example of Component Mounter 10

Figure 1:
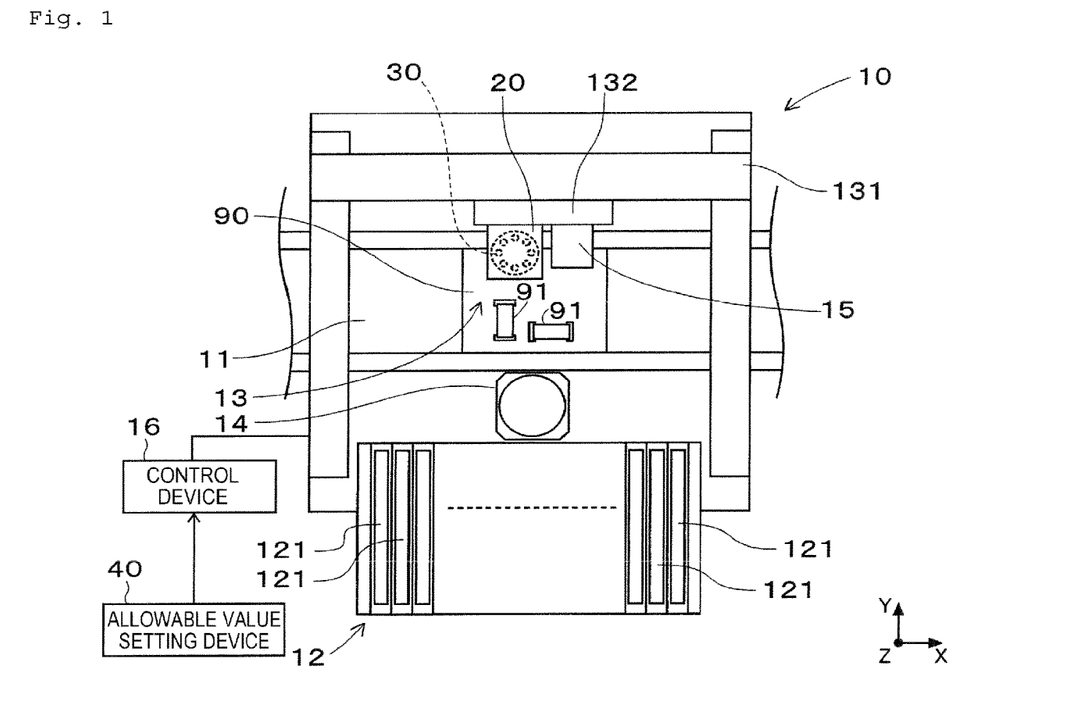
FIG. 1 is a plan view illustrating a configuration example of component mounter 10.

Component mounter 10 mounts multiple components 91 on board 90. As illustrated in FIG. 1, component mounter 10 includes board conveyance device 11, component supply device 12, component transfer device 13, part camera 14, board camera 15, and control device 16.

Board conveyance device 11 is configured by, for example, a belt conveyor or the like, and conveys board 90 in a conveyance direction (X-axis direction). Board 90 is a circuit board and at least one of an electronic circuit and an electrical circuit is formed. Board conveyance device 11 loads board 90 into component mounter 10 and positions board 90 at a predetermined position in component mounter 10. After a mounting process of multiple components 91 by component mounter 10 is completed, board conveyance device 11 unloads board 90 to the outside of component mounter 10.

Component supply device 12 supplies multiple components 91 to be mounted on board 90. Component supply device 12 includes multiple feeders 121 that are provided along the conveyance direction of board 90 (X-axis direction). Each of multiple feeders 121 pitch-feeds a carrier tape (not shown) that stores multiple components 91 to supply component 91 so that component 91 can be picked up at a supply position located on a distal end side of feeder 121. Also, component supply device 12 can supply relatively large electronic components (for example, lead components) as compared with chip components or the like, in a state of being disposed on a tray.

Component transfer device 13 includes head driving device 131 and moving body 132. Head driving device 131 is configured to move moving body 132 in the X-axis direction and the Y-axis direction by a linear motion mechanism. Mounting head 20 is detachably (exchangeably) attached to moving body 132 by a clamp member (not shown). Mounting head 20 picks up (sucks) and holds component 91 supplied by component supply device 12 by using at least one suction nozzle 30 and mounts component 91 on board 90 positioned by board conveyance device 11.

As part camera 14 and board camera 15, a well-known imaging device can be used. Part camera 14 is fixed to a base of component mounter 10 such that an optical axis thereof is directed upwards in a Z-axis direction (vertically upward direction). Part camera 14 can capture an image of component 91 held by suction nozzle 30 from below.

Board camera 15 is provided on moving body 132 of component transfer device 13 such that an optical axis thereof is directed downward in the Z-axis direction (vertically downward direction). Board camera 15 can capture an image of board 90 from above. Part camera 14 and board camera 15 perform imaging based on control signals transmitted from control device 16. Image data captured by part camera 14 and board camera 15 is transmitted to control device 16.

Control device 16 includes a well-known computing device and a storage device, and a control circuit is configured therein (both of which are not shown). Information, image data, and the like output from various sensors provided in component mounter 10 are input to control device 16. Control device 16 transmits a control signal to each device, based on a control program, a predetermined mounting condition set in advance, and the like.

For example, control device 16 causes board camera 15 to capture an image of board 90 that is positioned by board conveyance device 11. Control device 16 performs image processing with respect to the image captured by board camera 15 to recognize a positioning state of board 90. In addition, control device 16 causes suction nozzle 30 to pick up (suck) and hold component 91 supplied by component supply device 12, and causes part camera 14 to capture an image of component 91 held by suction nozzle 30. Control device 16 performs image processing with respect to the image captured by part camera 14 to recognize a holding posture of component 91.

Control device 16 moves suction nozzle 30 toward an upper side of a mounting planned position set in advance by a control program or the like. In addition, control device 16 corrects the mounting planned position based on the positioning state of board 90, the holding posture of component 91, and the like, and sets a mounting position on which component 91 is actually mounted. The mounting planned position and the mounting position include a rotation angle in addition to the positions (X-coordinate and Y-coordinate).

Control device 16 corrects a target position (X-coordinate and Y-coordinate) and the rotation angle of suction nozzle 30 in accordance with the mounting position. Control device 16 lowers suction nozzle 30 at the corrected rotation angle at the corrected target position to mount component 91 on board 90. Control device 16 repeats the pick-and-place cycle described above to execute the mounting process of mounting multiple components 91 on board 90.

1-2. Configuration Example of Allowable Value Setting Device 40

Figure 2:
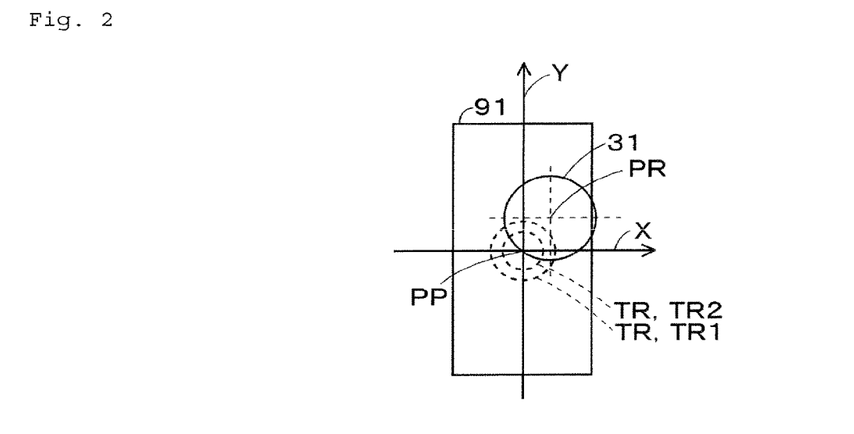
FIG. 2 is a schematic diagram illustrating an example of a relationship between target pickup position PP and actual pickup position PR.

Allowable value setting device 40 sets allowable value TR of a deviation amount between target pickup position PP and actual pickup position PR in component 91 when component 91 is picked up by suction nozzle 30. FIG. 2 illustrates an example of a relationship between target pickup position PP and actual pickup position PR. FIG. 2 is a plan view as seen from a side of suction nozzle 30 when component 91 is picked up by suction nozzle 30, and illustrates a positional relationship between nozzle tip portion 31 of suction nozzle 30 and component 91.

Target pickup position PP illustrated in FIG. 2 is a center position of component 91, and actual pickup position PR illustrated in FIG. 2 is an axial position of suction nozzle 30. It should be noted that target pickup position PP is not limited to the center position of component 91 and may be, for example, a centroid position of component 91. The shape of nozzle tip portion 31 is not limited to a circular shape and may be, for example, an elliptical shape.

As illustrated in FIG. 2, when the deviation amount between target pickup position PP and actual pickup position PR increases, nozzle tip portion 31 of suction nozzle 30 may protrude from component 91. In this case, when component 91 is mounted on board 90, an adjacent member (for example, component 91 or a wall surface of an accommodation portion accommodating component 91) adjacent to component 91 and nozzle tip portion 31 may interfere with each other. In addition, when the deviation amount between target pickup position PP and actual pickup position PR increases, the suction state of component 91 may become unstable.

Therefore, in component mounter 10, allowable value TR of the deviation amount between target pickup position PP and actual pickup position PR is set. Control device 16 of component mounter 10, for example, performs image processing with respect to the image captured by part camera 14 to measure the deviation amount between target pickup position PP and actual pickup position PR. When the deviation amount is within allowable value TR, control device 16 allows the mounting of component 91, and when the deviation amount exceeds allowable value TR, control device 16 prohibits the mounting of component 91 and causes component 91 to be discarded.

Here, when component 91 is mounted on board 90, component 91 in which a gap between component 91 and the adjacent member adjacent to component 91 is narrower than a predetermined gap (the maximum gap at which nozzle tip portion 31 may interfere with the adjacent member) is regarded as a first component. In addition, component 91 for which a certain level of stability is required (in other words, a certain level of mounting accuracy is required) in the suction state of component 91 is regarded as a second component. Further, allowable value TR set for each component type of component 91 is regarded as first allowable value TR1. The first component is one form of the second component.

Allowable value TR for the first component may be set smaller than first allowable value TR1 from the viewpoint of avoiding interference between nozzle tip portion 31 and the adjacent member. On the other hand, as allowable value TR for component 91 other than the first component (component 91 having a gap wider than the predetermined gap), there is no problem even if first allowable value TR1 is adopted. In addition, allowable value TR for the second component may be set smaller than first allowable value TR1 from the viewpoint of stabilizing the suction state of component 91 (improvement of the mounting accuracy). On the other hand, as allowable value TR for component 91 other than the second component (component 91 with fewer requirements described above), there is no problem even if first allowable value TR1 is adopted.

If the same allowable value TR smaller than first allowable value TR1 is set for all components 91 of the same component type as allowable value TR, strict conditions are applied to components 91 having no problem even if allowable value TR (first allowable value TR1) set for each component type is adopted, which leads to an increase in the disposal rate of component 91. Accordingly, allowable value setting device 40 of the present embodiment sets two types of allowable values (first allowable value TR1 and second allowable value TR2) having different priorities with respect to allowable value TR of the deviation amount between target pickup position PP and actual pickup position PR when component 91 is picked up.

Figure 3:
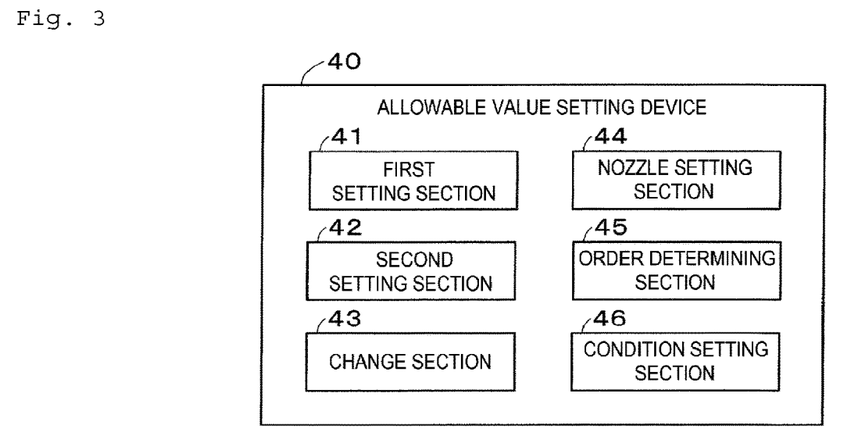
FIG. 3 is a block diagram illustrating an example of a control block of allowable value setting device 40.

Specifically, allowable value setting device 40 includes first setting section 41 and second setting section 42 when viewed as a control block. In addition, it is preferable that allowable value setting device 40 further include at least one of change section 43, nozzle setting section 44, order determining section 45, and condition setting section 46. However, when allowable value setting device 40 includes order determining section 45, allowable value setting device 40 includes nozzle setting section 44.

As illustrated in FIG. 3, allowable value setting device 40 of the present embodiment includes first setting section 41, second setting section 42, change section 43, nozzle setting section 44, order determining section 45, and condition setting section 46. As illustrated in FIG. 1, allowable value setting device 40 of the present embodiment is provided separately from component mounter 10, but may be provided in various devices such as control device 16 of component mounter 10, a management device (not shown) for managing component mounter 10, and the like.

1-2-1. First Setting Section 41

First setting section 41 sets first allowable value TR1, which is allowable value TR for each component type of component 91 to be mounted on board 90. First setting section 41 can set first allowable value TR1 for each component type, for example, based on external dimensions and external shapes of components 91.

Specifically, first setting section 41 can set first allowable value TR1 smaller as the external dimension of component 91 becomes smaller (as component 91 becomes smaller). In addition, first setting section 41 can also set first allowable value TR1 smaller as the external shape of component 91 becomes more complicated. First allowable value TR1 set by first setting section 41 can be included in, for example, component data.

Figure 4:
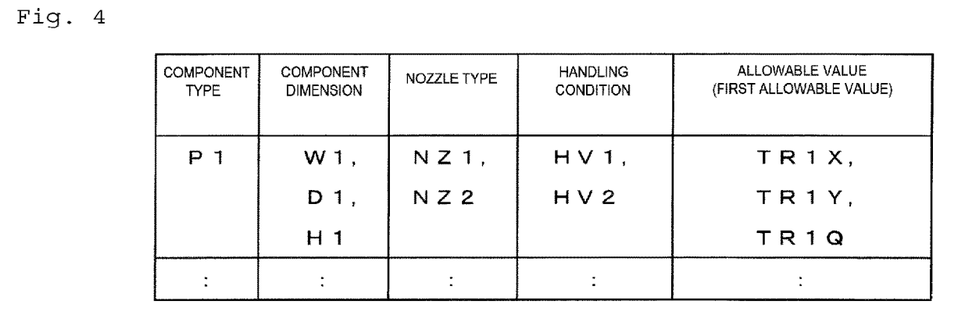
FIG. 4 is a schematic diagram illustrating an example of component data.

FIG. 4 illustrates an example of the component data. The component data illustrated in FIG. 4 includes a component type, a component dimension, a nozzle type, a handling condition, and an allowable value TR (first allowable value TR1). In FIG. 4, for convenience of illustration, only the component data of component 91 of component type P1 is described, but the component data of multiple types of components 91 can be included. The component data are not limited to those illustrated in FIG. 4. The component data may include, for example, various information about component 91, such as shape data of component 91.

The component dimension represents the external dimensions of component 91. The external dimensions of component 91 of component type P1 are represented by width W1, depth D1, and height H1. The nozzle type represents the type of suction nozzle 30 that can be used. Suction nozzle 30 that can be used to pick up component 91 of component type P1 includes suction nozzle 30 of nozzle type NZ1 and nozzle type NZ2. Suction nozzle 30 of nozzle type NZ1 represents suction nozzle 30 used in the suction process of component 91 for which first allowable value TR1 is set by first setting section 41. Suction nozzle 30 of nozzle type NZ2 represents suction nozzle 30 used in the suction process of component 91 for which second allowable value TR2 is set by second setting section 42 described below.

The handling condition represents an operation condition of mounting head 20 (for example, a movement speed of mounting head 20 or the like). The operation conditions of mounting head 20 when component 91 of component type P1 is picked up and mounted include condition HV1 and condition HV2. Condition HV1 represents an operation condition of mounting head 20 when suction nozzle 30 that picks up component 91 for which first allowable value TR1 is set by first setting section 41 is moved. Condition HV2 represents an operation condition of mounting head 20 when suction nozzle 30 that picks up component 91 for which second allowable value TR2 is set by second setting section 42 described below is moved.

First allowable value TR1 can be represented using the X-coordinate, the Y-coordinate, and the rotation angle in the XY-Cartesian coordinate system. First allowable value TR1 of component 91 of component type P1 has allowable value TR1X in the X-axis direction, allowable value TR1Y in the Y-axis direction, and allowable value TR1Q in the rotation angle.

1-2-2. Second Setting Section 42

Second setting section 42 sets second allowable value TR2. Second allowable value TR2 is allowable value TR that is smaller than first allowable value TR1 of component 91 of the same component type that is set for each mounting coordinate of component 91 and is set by first setting section 41. Second allowable value TR2 is preferentially adopted over first allowable value TR1 in the suction process of component 91.

The first component described above is component 91 in which the gap between component 91 and the adjacent member adjacent to component 91 is narrower than the predetermined gap when component 91 is mounted on board 90. Accordingly, from the viewpoint of avoiding interference between nozzle tip portion 31 and the adjacent member, second setting section 42 may set second allowable value TR2 for the first component. The above-described second component is a component 91 for which a certain level of stability is required (for which a certain level of mounting accuracy is required) in the suction state of component 91. Accordingly, from the viewpoint of stabilizing the suction state of component 91 (improvement of the mounting accuracy), second setting section 42 may set second allowable value TR2 for the second component. Second allowable value TR2 set by second setting section 42 can be included in, for example, mounting use data.

Figure 5:
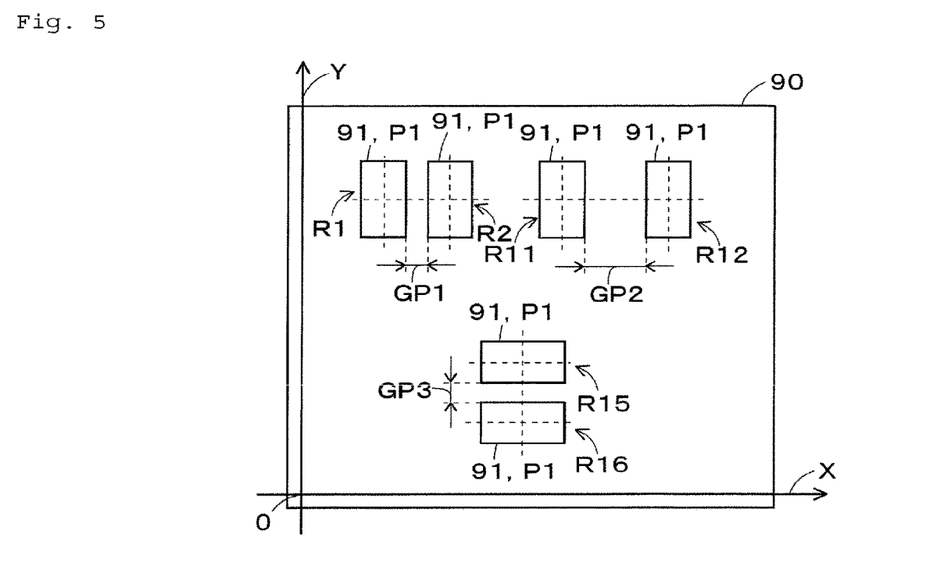
FIG. 5 is a plan view illustrating an example of component 91 to be mounted on board 90.

FIG. 5 illustrates an example of component 91 to be mounted on board 90. FIG. 5 illustrates that components 91 having circuit number R1, circuit number R2, circuit number R11, circuit number R12, circuit number R15, and circuit number R16 is components 91 having component type P1. The gap between adjacent components 91 of circuit number R1 and circuit number R2 is gap GP1. The gap between adjacent components 91 of circuit number R11 and circuit number R12 is gap GP2. The gap between adjacent components 91 of circuit number R15 and circuit number R16 is gap GP3. In addition, both gap GP1 and gap GP3 are narrower than the predetermined gap, and gap GP2 is wider than the predetermined gap.

Figure 6:
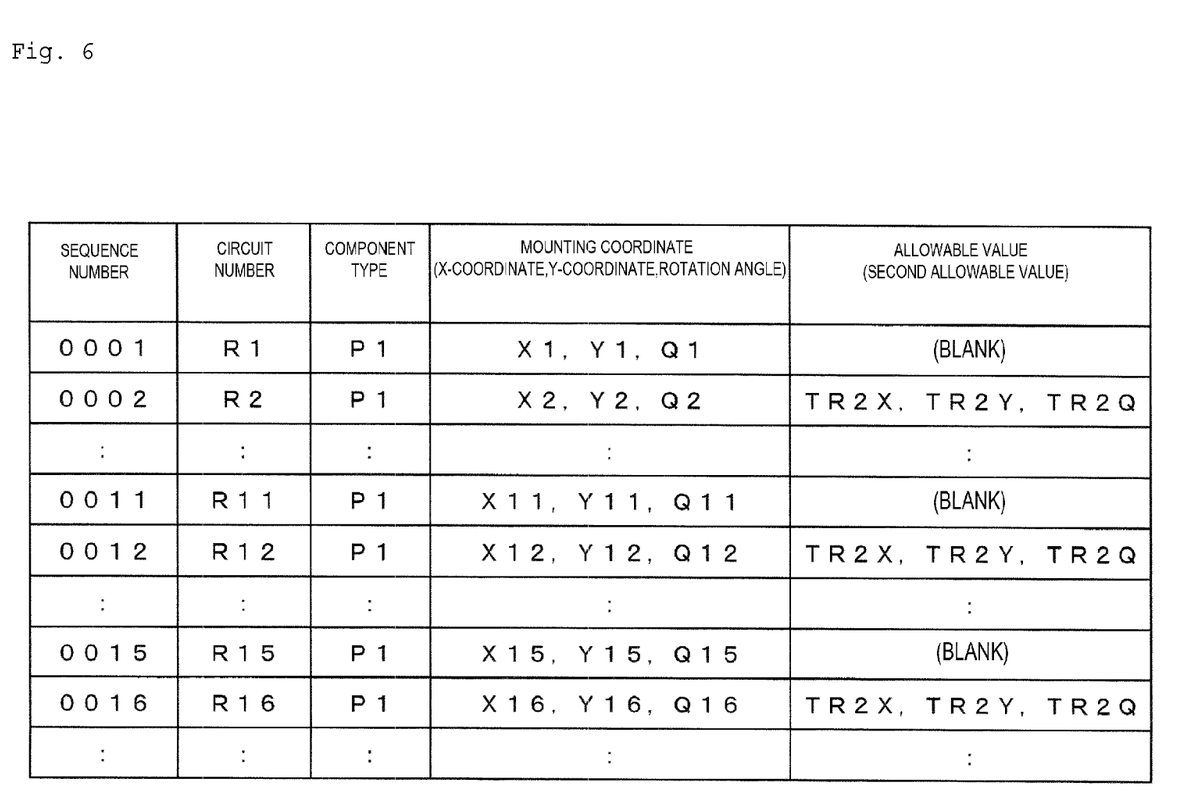
FIG. 6 is a schematic diagram illustrating an example of mounting use data.

FIG. 6 illustrates an example of mounting use data. The mounting use data is data used when component mounter 10 mounts component 91 on board 90. The mounting use data illustrated in FIG. 6 includes a sequence number, a circuit number, a component type, mounting coordinates, and allowable value TR (second allowable value TR2). In FIG. 6, for convenience of illustration, only the mounting use data of component 91 of component type P1 is described, but the mounting use data of multiple types of components 91 can be included. The mounting use data is not limited to those illustrated in FIG. 6. The mounting use data may include, for example, various information about mounting conditions, devices to be used, and the like.

The sequence number represents the mounting order of components 91. FIG. 6 illustrates mounting of component 91 on board 90 in order from the sequence number 0001. The circuit number corresponds to the circuit number illustrated in FIG. 5, and the component type corresponds to the component type illustrated in FIG. 4 and FIG. 5. The mounting coordinates can be represented using the X-coordinate, the Y-coordinate, and the rotation angle in the XY-Cartesian coordinate system. The X-coordinate and the Y-coordinate represent coordinates of the center position of component 91. For example, the center position of component 91 of circuit number R1 has the X-coordinate as coordinate X1, the Y-coordinate as coordinate Y1, and the rotation angle of component 91 as angle Q1. Components 91 having other circuit numbers are also represented in the same manner.

Since gap GP1 illustrated in FIG. 5 is narrower than the predetermined gap, and component 91 having circuit number R2 is mounted after circuit number R1, second setting section 42 sets second allowable value TR2 at least for component 91 having circuit number R2. Similarly, since gap GP3 is narrower than the predetermined gap, and component 91 having circuit number R16 is mounted after circuit number R15, second setting section 42 sets second allowable value TR2 at least for component 91 having circuit number R16.

For example, it is assumed that component 91 having circuit number R12 is component 91 for which a certain level of stability is required (a certain level of mounting accuracy is required) in the suction state of component 91, and is regarded as a second component. At this time, second setting section 42 sets second allowable value TR2 for component 91 having circuit number R12.

Second allowable value TR2 can be represented using the X-coordinate, the Y-coordinate, and the rotation angle in the XY-Cartesian coordinate system. Second allowable value TR2 of component 91 having circuit number R2 has allowable value TR2X in the X-axis direction, allowable value TR2Y in the Y-axis direction, and allowable value TR2Q in the rotation angle. Second allowable value TR2 is also represented in the same manner for component 91 having circuit number R12 and circuit number R16. For component 91 having circuit number R1, circuit number R11, and circuit number R15, the allowable value is set to blank instead of second allowable value TR2.

It should be noted that since component 91 having circuit number R1 is mounted ahead of component 91 having circuit number R2, nozzle tip portion 31 does not interfere with component 91 having circuit number R2 when component 91 having circuit number R1 is mounted. Therefore, second setting section 42 of the present embodiment does not set second allowable value TR2 for component 91 having circuit number R1. However, in consideration of the fact that gap GP1 is narrower than the predetermined gap and component 91 having circuit number R2 needs to be mounted after component 91 having circuit number R1 is mounted, component 91 having circuit number R1 is required to have mounting accuracy as compared with, for example, component 91 having circuit number R11.

Accordingly, second setting section 42 can also set second allowable value TR2 for component 91 having circuit number R1. When second allowable value TR2 is set for component 91 having circuit number R1, condition setting section 46 described later can easily set the operation condition of mounting head 20 for moving suction nozzle 30 to the same operation condition (condition HV2) as the second component. The above description can be similarly applied to component 91 having circuit number R15.

When second allowable value TR2 is set in the mounting use data, second allowable value TR2 is adopted in the suction process of component 91. When second allowable value TR2 is not set in the mounting use data, first allowable value TR1 set in the component data is adopted in the suction process of component 91. Second allowable value TR2 may be appropriately changed based on, for example, the mounting state in which component 91 is actually mounted. Therefore, it is preferable that second allowable value TR2 be included in the mounting use data. As a result, it is possible to avoid the occurrence of an operation of changing the component data in accordance with the change of second allowable value TR2.

It is preferable that second setting section 42 set second allowable value TR2 based on a setting element including at least the mounting coordinates, among the mounting coordinates, the dimensional tolerance of component 91, and the mounting accuracy when component 91 is actually mounted. As a result, allowable value setting device 40 of the present embodiment can improve the setting accuracy of second allowable value TR2.

Second setting section 42 can, for example, set second allowable value TR2 for the first component by the method described below. Second setting section 42 can calculate the gap (design value) between adjacent components 91, for example, based on the respective mounting coordinates of adjacent components 91 and the external dimensions of component 91.

As illustrated in FIG. 6, for example, the mounting coordinate (X-coordinate) of component 91 having circuit number R1 is coordinate X1, and the mounting coordinate (X-coordinate) of component 91 having circuit number R2 is coordinate X2. In the example illustrated in FIG. 5, a center-to-center distance between adjacent components 91 having circuit numbers R1 and R2 can be calculated from coordinates X1 and X2. In this case, gap GP1 is obtained by subtracting the lateral dimension (the dimension in the short-side direction) of component 91 from the center-to-center distance of component 91.

Second setting section 42 sets second allowable value TR2 so that a protruding amount of nozzle tip portion 31 from component 91 is at least equal to or less than the calculated gap (design value). In the above example, second setting section 42 sets second allowable value TR2 so that the protruding amount of nozzle tip portion 31 from component 91 is equal to or less than gap GP1. In addition, since the external dimension of component 91 may vary within a range of the dimensional tolerance of component 91, second setting section 42 may consider the dimensional tolerance of component 91 (using the maximum dimension of component 91) when calculating the gap (design value).

In addition, since second allowable value TR2 set by the above-described method does not consider an operation error or the like of the device (for example, mounting head 20 or the like), second setting section 42 may provide a margin corresponding to the operation error of the device to second allowable value TR2 set by the above-described method. The operation error of the device can be estimated, for example, from the mounting accuracy (degree of variation in the actual mounting position with respect to the target mounting position) when component 91 is actually mounted on the actual machine.

It should be noted that the above-described method can individually set second allowable value TR2 for the first components, but the setting operation of second allowable value TR2 may be complicated when the number of the first components increases. The mounting coordinates at which the interference between nozzle tip portion 31 and the adjacent member becomes a problem are often designed such that the gap becomes several types of predetermined gaps at the design stage of board 90. For example, gap GP3 illustrated in FIG. 5 is designed to have the same size as gap GP1, and second allowable value TR2 illustrated in FIG. 6 is set to the same value regardless of the mounting coordinates.

The second component is component 91 for which a certain level of stability is required (a certain level of mounting accuracy is required) in the suction state of component 91. Accordingly, second setting section 42 may set second allowable value TR2 according to the request for each mounting coordinate. Similar to the first component, second setting section 42 may set second allowable value TR2 for the second component in consideration of the dimensional tolerance of component 91.

Further, similar to the first component, second setting section 42 may set second allowable value TR2 for the second component in consideration of the mounting accuracy when component 91 is actually mounted. Since the first component is one form of the second component, second setting section 42 may also set second allowable value TR2 of the second component to the same value as second allowable value TR2 of the first component.

1-2-3. Change Section 43

Change section 43 collectively changes second allowable value TR2 set by second setting section 42 for components 91 of the same component type. As a result, allowable value setting device 40 of the present embodiment can easily change second allowable value TR2 as compared with the case where second allowable value TR2 is individually changed for each mounting coordinate.

As described above, second allowable value TR2 illustrated in FIG. 6 is set to the same value regardless of the mounting coordinates. Accordingly, when changing second allowable value TR2 set to one mounting coordinate, change section 43 can simultaneously change second allowable value TR2 set to another mounting coordinate. In addition, in a case where the gap between nozzle tip portion 31 and the adjacent member is designed to be several types of predetermined gaps, change section 43 can change second allowable value TR2 collectively in units of groups by dividing the gap into multiple groups according to the size of the gap.

1-2-4. Nozzle Setting Section 44

Nozzle setting section 44 can set, as suction nozzle 30 to be used in the suction process of component 91, suction nozzles 30 having different contact areas each being a contact area with component 91 when component 91 is picked up, between component 91 for which first allowable value TR1 is set by first setting section 41 and component 91 for which second allowable value TR2 is set by second setting section 42, for components 91 of the same component type.

As described above, suction nozzle 30 of nozzle type NZ1 illustrated in FIG. 4 represents suction nozzle 30 to be used in the suction process of component 91 for which first allowable value TR1 is set by first setting section 41. Suction nozzle 30 of nozzle type NZ2 represents suction nozzle 30 to be used in the suction process of component 91 for which second allowable value TR2 is set by second setting section 42. At this time, nozzle setting section 44 can set the contact area between suction nozzle 30 of nozzle type NZ2 and component 91 to be smaller than suction nozzle 30 of nozzle type NZ1.

In the first component described above, the gap between component 91 when mounted on board 90 and the adjacent member is narrower than the predetermined gap. Therefore, the first component for which second allowable value TR2 is set may use suction nozzle 30 of nozzle type NZ2 having a smaller contact area with component 91 as compared with suction nozzle 30 of nozzle type NZ1 in order to avoid interference between nozzle tip portion 31 and the adjacent member. In the example illustrated in FIG. 6, components 91 having circuit number R2 and circuit number R16 are the components corresponding to the above description.

Conversely, component 91 for which first allowable value TR1 is set does not have to avoid the above-described interference. Therefore, component 91 for which first allowable value TR1 is set may use suction nozzle 30 of nozzle type NZ1 in order to increase the contact area between component 91 and suction nozzle 30 to stabilize the suction state of component 91. In the example illustrated in FIG. 6, components 91 having circuit number R1, circuit number R11, and circuit number R15 are the components corresponding to the above description.

In addition, nozzle setting section 44 can also set, as suction nozzle 30 to be used in the suction process of component 91, suction nozzles 30 each having the same contact area with component 91 when component 91 is picked up, between component 91 for which first allowable value TR1 is set by first setting section 41 and component 91 for which second allowable value TR2 is set by second setting section 42, for components 91 of the same component type. In this case, each of suction nozzles 30 of nozzle type NZ1 and nozzle type NZ2 has the same contact area between component 91 and suction nozzle 30.

The above-described second component is required to have a certain level of stability (a certain level of mounting accuracy is required) in the suction state of component 91. Therefore, the second component for which second allowable value TR2 is set may use suction nozzle 30 of nozzle type NZ2 having the same contact area as suction nozzle 30 of nozzle type NZ1 in order to stabilize the suction state of component 91. In the example illustrated in FIG. 6, component 91 having circuit number R12 is the component corresponding to the above description.

The above description with respect to the second component can be similarly applied to a case where second allowable value TR2 is set for component 91 to be mounted first among the first components, from the viewpoint of improvement of the mounting accuracy described above. In the example illustrated in FIG. 6, components 91 having circuit number R1 and circuit number R15 are targeted.

1-2-5. Order Determining Section 45

Order determining section 45 determines a mounting order of components 91 to be mounted on board 90 according to the type of suction nozzle 30 set by nozzle setting section 44. As a result, allowable value setting device 40 of the present embodiment can determine an appropriate mounting order of components 91 according to the type of suction nozzle 30 set by nozzle setting section 44.

For example, since second allowable value TR2 is not set in component 91 having circuit number R1, circuit number R11, and circuit number R15 illustrated in FIG. 6, first allowable value TR1 is adopted as allowable value TR. As described above, component 91 to which first allowable value TR1 is adopted uses suction nozzle 30 of nozzle type NZ1. On the other hand, component 91 having circuit number R2 and circuit number R16 illustrated in FIG. 6 is a first component for which second allowable value TR2 is set, and uses suction nozzle 30 of nozzle type NZ2.

Component 91 having circuit number R12 is a second component for which second allowable value TR2 is set, and uses suction nozzle 30 of nozzle type NZ2 having the same contact area with component 91 as suction nozzle 30 of nozzle type NZ1. Therefore, component 91 having circuit number R12 may use suction nozzle 30 of nozzle type NZ1. In the case of the mounting order illustrated in FIG. 6, the nozzle type of suction nozzle 30 is switched three times in the mounting process of six components 91 from circuit number R1 to circuit number R16.

Specifically, after the mounting process of component 91 having circuit number R1 is performed using suction nozzle 30 of nozzle type NZ1, the mounting process of component 91 having circuit number R2 is performed using suction nozzle 30 of nozzle type NZ2. Next, the mounting process of components 91 having circuit number R11, circuit number R12, and circuit number R15 is performed using suction nozzle 30 of nozzle type NZ1. Then, the mounting process of component 91 having circuit number R16 is performed using suction nozzle 30 of nozzle type NZ2.

In the above example, order determining section 45, for example, can determine the mounting order of components 91 so that the number of times of switching the nozzle type of suction nozzle 30 is reduced. Specifically, order determining section 45 changes, for example, the mounting of component 91 having circuit number R2 after mounting of component 91 having circuit number R16.

In this case, the mounting process of components 91 having circuit number R1, circuit number R11, circuit number R12, and circuit number R15 is performed using suction nozzle 30 of nozzle type NZ1. Then, the mounting process of components 91 having circuit number R16 and circuit number R2 is performed using suction nozzle 30 of nozzle type NZ2. As a result, the number of times of switching the nozzle type of suction nozzle 30 is only once.

In addition, order determining section 45 may prevent the mounting process of component 91 using suction nozzle 30 of nozzle type NZ1 and the mounting process of component 91 using suction nozzle 30 of nozzle type NZ2 from mixing in one pick-and-place cycle. In this manner, the production efficiency of component mounter 10 is improved by order determining section 45 determining an appropriate mounting order of components 91.

1-2-6. Condition Setting Section 46

Condition setting section 46 can set, as an operation condition of mounting head 20 for moving suction nozzle 30, operation conditions different from each other between component 91 for which first allowable value TR1 is set by first setting section 41 and component 91 for which second allowable value TR2 is set by second setting section 42, for components 91 of the same component type. As a result, allowable value setting device 40 of the present embodiment can appropriately set the operation condition of mounting head 20.

As described above, condition HV1 illustrated in FIG. 4 represents an operation condition of mounting head 20 when suction nozzle 30 that picks up component 91 for which first allowable value TR1 is set by first setting section 41 is moved. Condition HV2 represents an operation condition of mounting head 20 when suction nozzle 30 that picks up component 91 for which second allowable value TR2 is set by second setting section 42 is moved. At this time, condition setting section 46 can set condition HV2 more strictly than condition HV1.

Condition setting section 46, for example, can reduce an operation speed of mounting head 20 with respect to component 91 for which second allowable value TR2 is set by second setting section 42, as compared with component 91 for which first allowable value TR1 is set by first setting section 41. The operation speed of mounting head 20 includes, for example, a movement speed of mounting head 20, a lowering speed when a lifting and lowering member (for example, a syringe) holding suction nozzle 30 is lowered, and the like.

In addition, condition setting section 46, for example, can set operation accuracy of mounting head 20 to be higher for component 91 for which second allowable value TR2 is set by second setting section 42, as compared with component 91 for which first allowable value TR1 is set by first setting section 41. The operation accuracy of mounting head 20 includes, for example, positioning accuracy of mounting head 20 and the lifting and lowering member. Condition setting section 46, for example, can set the waiting time during which mounting head 20 waits until the lifting and lowering member stops to be longer for component 91 for which second allowable value TR2 is set by second setting section 42, as compared with component 91 for which first allowable value TR1 is set by first setting section 41.

The first component for which second allowable value TR2 is set needs to avoid interference between nozzle tip portion 31 and the adjacent member. At this time, condition setting section 46 reduces the operation speed of mounting head 20 with respect to the first component for which second allowable value TR2 is set, as compared with component 91 for which first allowable value TR1 is set. In addition, condition setting section 46 sets the operation accuracy of mounting head 20 to be higher for the first component for which the second allowable value TR2 is set, as compared with component 91 for which first allowable value TR1 is set. As a result, the interference between nozzle tip portion 31 and the adjacent member can be easily avoided.

The second component for which second allowable value TR2 is set needs to stabilize the suction state of component 91. At this time, condition setting section 46 reduces the operation speed of mounting head 20 with respect to the second component for which second allowable value TR2 is set, as compared with component 91 for which first allowable value TR1 is set. In addition, condition setting section 46 sets the operation accuracy of mounting head 20 to be higher for the second component for which second allowable value TR2 is set, as compared with component 91 for which first allowable value TR1 is set. As a result, the suction state of component 91 can be easily stabilized. The above description with respect to the second component can be similarly applied to a case where second allowable value TR2 is set for component 91 to be mounted first among the first components, from the viewpoint of improvement of the mounting accuracy described above.

2. Allowable Value Setting Method

The above description of allowable value setting device 40 can be similarly applied to the allowable value setting method. Specifically, the allowable value setting method includes a first setting step and a second setting step. The first setting step corresponds to the control performed by first setting section 41. The second setting step corresponds to the control performed by second setting section 42.

It is preferable that the allowable value setting method further include at least one of a changing step, a nozzle setting step, an order determining step, and a condition setting step. The changing step corresponds to the control performed by change section 43. The nozzle setting step corresponds to the control performed by nozzle setting section 44. The order determining step corresponds to the control performed by order determining section 45. The condition setting step corresponds to the control performed by condition setting section 46. However, the allowable value setting method includes the nozzle setting step when the order determining step is included.

3. Example of Effect of Embodiment

According to allowable value setting device 40, first setting section 41 and second setting section 42 are provided. As a result, allowable value setting device 40 can set two types of allowable values (first allowable value TR1 and second allowable value TR2) having different priorities with respect to allowable value TR of the deviation amount between target pickup position PP and actual pickup position PR when component 91 is picked up. The above description with respect to the allowable value setting device 40 can be similarly applied to the allowable value setting method.

REFERENCE SIGNS LIST

20: mounting head, 30: suction nozzle, 40: allowable value setting device, 41: first setting section, 42: second setting section, 43: change section, 44: nozzle setting section, 45: order determining section, 46: condition setting section, 90: board, 91: component, PP: target pickup position, PR: actual pickup position, TR: allowable value, TR1: first allowable value, TR2: second allowable value

The invention claimed is:

1. An allowable value setting device for setting an allowable value of a deviation amount between a target pickup position and an actual pickup position in a component when the component is picked up by a suction nozzle, the device comprising:
a first setting section configured to set a first allowable value, which is the allowable value for each component type of the component to be mounted on a board; and
a second setting section configured to set a second allowable value, which is the allowable value that is set for each mounting coordinate of the component and smaller than the first allowable value of the component of the same component type set by the first setting section, the second allowable value being preferentially adopted over the first allowable value in a suction process of the component.

2. The allowable value setting device according to claim 1,
wherein the second setting section sets the second allowable value, based on a setting element including at least the mounting coordinates among the mounting coordinates, dimensional tolerance of the component, and mounting accuracy when the component is actually mounted.

3. The allowable value setting device according to claim 1, further comprising:
a change section configured to collectively change the second allowable value set by the second setting section, for the components of the same component type.

4. The allowable value setting device according to claim 1, further comprising:
a nozzle setting section configured to set, as the suction nozzle to be used in the suction process of the component, the suction nozzles having different contact areas each being a contact area with the component when the component is picked up, between the component for which the first allowable value is set by the first setting section and the component for which the second allowable value is set by the second setting section, for the components of the same component type.

5. The allowable value setting device according to claim 4, further comprising:
an order determining section configured to determine a mounting order of the components to be mounted on the board according to a type of the suction nozzle set by the nozzle setting section.

6. The allowable value setting device according to claim 1, further comprising:
a condition setting section configured to set, as an operation condition of a mounting head for moving the suction nozzle, operation conditions different from each other between the component for which the first allowable value is set by the first setting section and the component for which the second allowable value is set by the second setting section, for the components of the same component type.

7. An allowable value setting method for setting an allowable value of a deviation amount between a target pickup position and an actual pickup position in a component when the component is picked up by a suction nozzle, the method comprising:
a first setting step of setting a first allowable value, which is the allowable value for each component type of the component to be mounted on a board; and
a second setting step of setting a second allowable value, which is the allowable value that is set for each mounting coordinate of the component and smaller than the first allowable value of the component of the same component type set by the first setting step, the second allowable value being preferentially adopted over the first allowable value in a suction process of the component.

\* \* \* \* \*